United States Patent
Sestok, IV

(10) Patent No.: US 10,161,978 B2
(45) Date of Patent: Dec. 25, 2018

(54) IMPEDANCE ANALYZER USING SQUARE WAVE STIMULI

(71) Applicant: Texas Instruments Incorporated, Dallas, TX (US)

(72) Inventor: Charles Kasimer Sestok, IV, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/344,565

(22) Filed: Nov. 6, 2016

(65) Prior Publication Data
US 2017/0254844 A1  Sep. 7, 2017

Related U.S. Application Data

(60) Provisional application No. 62/301,818, filed on Mar. 1, 2016, provisional application No. 62/301,836, filed on Mar. 1, 2016.

(51) Int. Cl.
| | | |
|---|---|---|
| G01R 27/02 | (2006.01) | |
| G01R 27/28 | (2006.01) | |
| G01R 27/14 | (2006.01) | |

(52) U.S. Cl.
CPC ............. *G01R 27/28* (2013.01); *G01R 27/14* (2013.01)

(58) Field of Classification Search
CPC ........ G01R 27/02; G01R 27/28; G01R 27/32; G01R 27/2822; G01R 27/04; G01R 31/1218; G01R 31/02; G01R 31/021; G01R 31/28; G01R 31/024; G01R 31/2851; G01R 31/2884; G01R 31/2886; G01R 31/2896; G01R 31/2801; G01R 1/073; G01R 13/30;
(Continued)

(56) References Cited

U.S. PATENT DOCUMENTS

| | | |
|---|---|---|
| 4,041,382 A | 8/1977 | Washburn |
| 5,297,425 A | 3/1994 | Hamby et al. |
(Continued)

OTHER PUBLICATIONS

Chen, Chiouguey J., "Modified Goertzel Algorithm in DTMF Detection Using the TMS320C80," Texas Instruments Application Report, SPRA066, Jun. 1996 (19 pages).
(Continued)

*Primary Examiner* — Thang Le
(74) *Attorney, Agent, or Firm* — Michael A. Davis, Jr.; Charles A. Brill; Frank D. Cimino

(57) ABSTRACT

A microcontroller-based system for measuring the impedance of a device under test (DUT) (35) responsive to a square wave stimulus. A clock generator circuit (26) in the microcontroller (20) generates a clock signal at a base clock frequency. A first timer (25) divides down the base clock frequency by a first frequency divisor integer to set the stimulus frequency of a square wave generated by a general purpose input/output (GPIO) function (24), and a second timer (28) divides down the base clock frequency by a second frequency divisor integer to set the sampling frequency of an analog-to-digital converter (ADC) (30). A discrete Fourier transform executed by a processor (22) is used to determine the impedance of the DUT at the stimulus frequency. The first and second integers are selected so that aliased harmonics fall in different DFT bins from the fundamental tone.

19 Claims, 4 Drawing Sheets

(58) Field of Classification Search
CPC ............ G01R 13/242; G01R 31/31924; G01R 31/3004; G01R 31/31922; G01R 31/2608; G01R 31/2614
USPC ...... 324/602–611, 756.01, 763.01, 691, 512, 324/522, 525, 713, 762.01–762.03, 324/757.04, 756.07, 757.02
See application file for complete search history.

(56) References Cited

U.S. PATENT DOCUMENTS

| | | | |
|---|---|---|---|
| 8,604,809 B2 | 12/2013 | Eilersen | |
| 2001/0010467 A1* | 8/2001 | Oguma | A61B 5/0537 324/601 |
| 2005/0072874 A1 | 4/2005 | Denen et al. | |
| 2006/0182231 A1* | 8/2006 | Tan | G01R 13/029 379/30 |
| 2007/0268012 A1* | 11/2007 | Kawabata | G01R 31/31924 324/120 |
| 2008/0303538 A1* | 12/2008 | Orr | G01R 15/005 324/707 |
| 2011/0074392 A1* | 3/2011 | Bartlett | G01R 1/06766 324/76.44 |
| 2011/0115509 A1* | 5/2011 | Kim | G01R 31/31717 324/750.3 |
| 2011/0227587 A1* | 9/2011 | Nakanishi | G01R 31/3662 324/649 |
| 2014/0145729 A1* | 5/2014 | Sobolewski | G01R 27/02 324/612 |
| 2016/0077140 A1* | 3/2016 | Todi | G01R 27/02 333/17.3 |
| 2016/0274060 A1 | 9/2016 | Denenberg et al. | |

OTHER PUBLICATIONS

Mock, Pat, "Add DTMF Generation and Decoding to DSP-uP Designs," Texas Instruments Application Report, SPRA168, copyright 1997 (19 pages).

CDCE(L)913: Flexible Low Power LVCMOS Clock Generator with SSC Support for EMI Reduction, Texas Instruments datasheet dated Jun. 2007, revised Oct. 2016; located at http://www.ti.com/lit.ds.symlink/cdce913.pdf (35 pages).

* cited by examiner

IMPEDANCE ANALYZER USING SQUARE WAVE STIMULI

CROSS-REFERENCE TO RELATED APPLICATIONS

This application claims priority, under 35 U.S.C. § 119(e), of Provisional Application Nos. 62/301,818 and 62/301,836, both filed Mar. 1, 2016 and incorporated herein by this reference.

STATEMENT REGARDING FEDERALLY SPONSORED RESEARCH OR DEVELOPMENT

Not applicable.

BACKGROUND OF THE INVENTION

This invention is in the field of electronic measurement. Embodiments are more specifically directed to devices and methods of measuring the impedance of a circuit element.

As fundamental in the art, the electrical impedance of an electrical circuit or circuit component is the opposition to current that the circuit or component presents to an applied voltage. In general, impedance is a complex quantity, namely the sum of a resistance and a reactance, and varies with the frequency of the applied voltage. Impedance is of course an important factor in the manufacture of electronic circuits and systems, especially in determining the efficiency with which energy is delivered to the load of a circuit. In addition, impedance measurement and analysis can be used in electronic sensors, for example in determining the properties of a material or workpiece, or conditions of the surrounding environment.

Conventional impedance analyzers operate by applying a sinusoidal stimulus to the object under measurement (referred to herein as the "device under test", or "DUT"), and measuring the electrical response of the DUT to that sinusoid waveform. Typically, the response is measured at more than one frequency of the sinusoidal stimulus, for example over a "sweep" of input frequencies. The use of a single frequency sinusoid as the measurement stimulus at each of the frequencies of interest greatly simplifies the measurements, as harmonic interference in the response of the DUT is largely avoided.

Many modern electronic integrated circuits integrate essentially all necessary functional components of a computer system, whether general purpose or arranged for a particular end application. Those large scale integrated circuits that include the computational capability for controlling and managing a wide range of functions and useful applications are often referred to as a microcontroller, or in some implementations as a "system on a chip", or "SoC", device. Typical modern microcontroller architectures include one or more processor cores that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the same integrated circuit for acquiring and outputting the data processed by the processor cores.

The efficiencies provided by microcontrollers and SoCs have reduced the cost of implementing complex measurement and computational functions in applications for which such functionality had been cost-prohibitive. For example, sensors and controllers are now being deployed in a wide range of applications and environments, including in the widely-distributed networks of such sensors and controllers often referred to as the "Internet of Things" (IoT).

For these reasons, microcontroller-based sensors for the measurement and analysis of electrical impedance is attractive. FIG. 1 illustrates a conventional microcontroller-based impedance analyzer. In this example, microcontroller 10 includes digital frequency synthesizer 2, which generates a sample stream corresponding to the desired signal waveform indicated by signals from processor 5. In this example, this sample stream corresponds to a sinusoidal waveform of a selected frequency. The sample stream generated by digital frequency synthesizer 2 is applied to digital-to-analog converter (DAC) 4, which is also realized within microcontroller 10, and which generates the output sinusoidal stimulus $V_{in}$ that will be applied to the device under test (DUT) 15 for measurement of its impedance. DUT 15 is a two-terminal device, having one terminal receiving stimulus voltage $V_{in}$ (after additional filtering, if desired), and its other terminal coupled to the inverting input of operational amplifier 16. Op amp 16 receives a reference voltage, for example at ½ the peak-to-peak amplitude of stimulus voltage $V_{in}$, at its non-inverting input. Reference impedance 18 is connected in negative feedback fashion between the output of op amp 16 and its inverting input. The output voltage $V_{meas}$ from op amp 16 is received by microcontroller 10, and converted to the digital domain by analog-to-digital converter (ADC) 6.

In this conventional inverting amplifier arrangement, the ratio of output voltage $V_{meas}$ to stimulus voltage $V_{in}$ reflects the impedance of DUT 15 relative to the impedance $Z_{REF}$ of reference impedance 18. Op amp 16 maintains a virtual ground at its inverting input, and as such the voltage drop across DUT 15 will be the input voltage $V_{in}$. Additionally, because the input of op amp 16 exhibits a significantly higher impedance than feedback impedance $Z_{REF}$, effectively all of the current conducted through DUT 15 will pass through feedback impedance $Z_{REF}$. Output voltage $V_{meas}$ will thus be proportional to this DUT current conducted through feedback impedance $Z_{REF}$. For example, if the impedance of DUT 15 exactly matches the feedback impedance $Z_{REF}$, output voltage $V_{meas}$ will match stimulus voltage $V_{in}$. Accordingly, the impedance of DUT 15 can be determined from the output voltage $V_{meas}$ presented by op amp 16. As mentioned above, this measurement is performed over frequency by the conventional architecture of FIG. 1, typically by processor 5 controlling digital frequency synthesizer 2 to sweep the frequency of the stimulus voltage $V_{in}$ applied to DUT 15. ADC 6 samples and digitizes output voltage $V_{meas}$ representing the response of DUT 15 to the stimulus at each frequency, and processor 5 analyzes that sample stream, for example via a discrete Fourier transform (DFT), to determine the impedance of DUT 15 at each frequency in the sweep. Both the amplitude and phase of output voltage $V_{meas}$ relative to stimulus voltage $V_{in}$ are considered in quantifying the inductive and capacitive components of the impedance of DUT 15.

As shown in the conventional arrangement of FIG. 1, DUT 15 is connected in parallel with calibration impedance 14, with switches 13 selecting one or the other of these loads. As known in the art, calibration impedance 14 is a known precision impedance that is useful in calibrating the impedance measurement for non-idealities in op amp 16 or presented by the text fixture retaining DUT 15. As suggested in FIG. 1, calibration impedance 14 and may be a variable impedance device (e.g., a bank of selectable precision resistors) to provide accurate calibration over a wide range of impedances. Similarly, reference impedance 18 may also be a variable impedance so as to better match the expected impedance of DUT 15.

While this conventional architecture is capable of analyzing a wide range of load impedances, the use of a sinusoidal stimulus voltage $V_{in}$ requires the relatively costly circuitry of digital frequency synthesis function 2 and DAC 4, especially if impedance is to be measured at reasonably high precision and at fine resolution. In particular, the number of bits of resolution in the sample stream of the stimulus waveform, as well as the sample rate of that sample stream, translates directly into the complexity of the DAC circuit. As is well known in the art, complex DAC circuits consume significant chip area, and can significantly increase the cost of the microcontroller device. This cost factor can be significant in modern embedded processors and SoC devices, and can limit the sensor applications for which impedance measurements can be performed.

BRIEF SUMMARY OF THE INVENTION

Disclosed embodiments provide circuitry and accompanying method for measuring impedance, and that may be efficiently implemented in a microcontroller context.

Disclosed embodiments provide such circuitry and a method that can utilize general purpose input/output functions of a microcontroller to generate the stimulus for the impedance measurement.

Disclosed embodiments provide such circuitry and a method that can measure impedances at relatively high frequencies.

Other objects and advantages of the disclosed embodiments will be apparent to those of ordinary skill in the art having reference to the following specification together with its drawings.

According to certain embodiments, an impedance analyzer for measuring the impedance of a device under test (DUT) is provided. Clock circuitry generates a base clock signal, from which a first timer divides down the base clock frequency by a first frequency divisor integer to set a stimulus frequency, and from which a second timer divides down the frequency by a second frequency divisor integer to set a sampling frequency for an analog-to-digital converter (ADC). A driver circuit generates a square wave stimulus at the stimulus frequency, which is filtered by an anti-aliasing filter and applied to the DUT. An inverting amplifier circuit produces a response voltage that is sampled by the ADC at the sampling frequency. The resulting sample stream is processed by a discrete Fourier transform, and the DUT impedance is determined from a selected DFT frequency bin. The first and second frequency divisor integers are selected so that the number of samples in the DFT window is an integer multiple of the first integer divided by the greatest common divisor of the first and second integers. The stimulus frequency may be swept for analysis of the impedance over frequency.

DETAILED DESCRIPTION OF THE INVENTION

One or more embodiments of this invention are described in this specification as implemented into a microcontroller or other large scale integrated circuits, as it is contemplated that the implementation of these embodiments will be particularly advantageous in that context. However, it is also contemplated that concepts of this invention may be beneficially applied to other applications that carry out the measurement or analysis of an electrical impedance. Accordingly, it is to be understood that the following description is provided by way of example only, and is not intended to limit the true scope of this invention as claimed.

Figure 2:
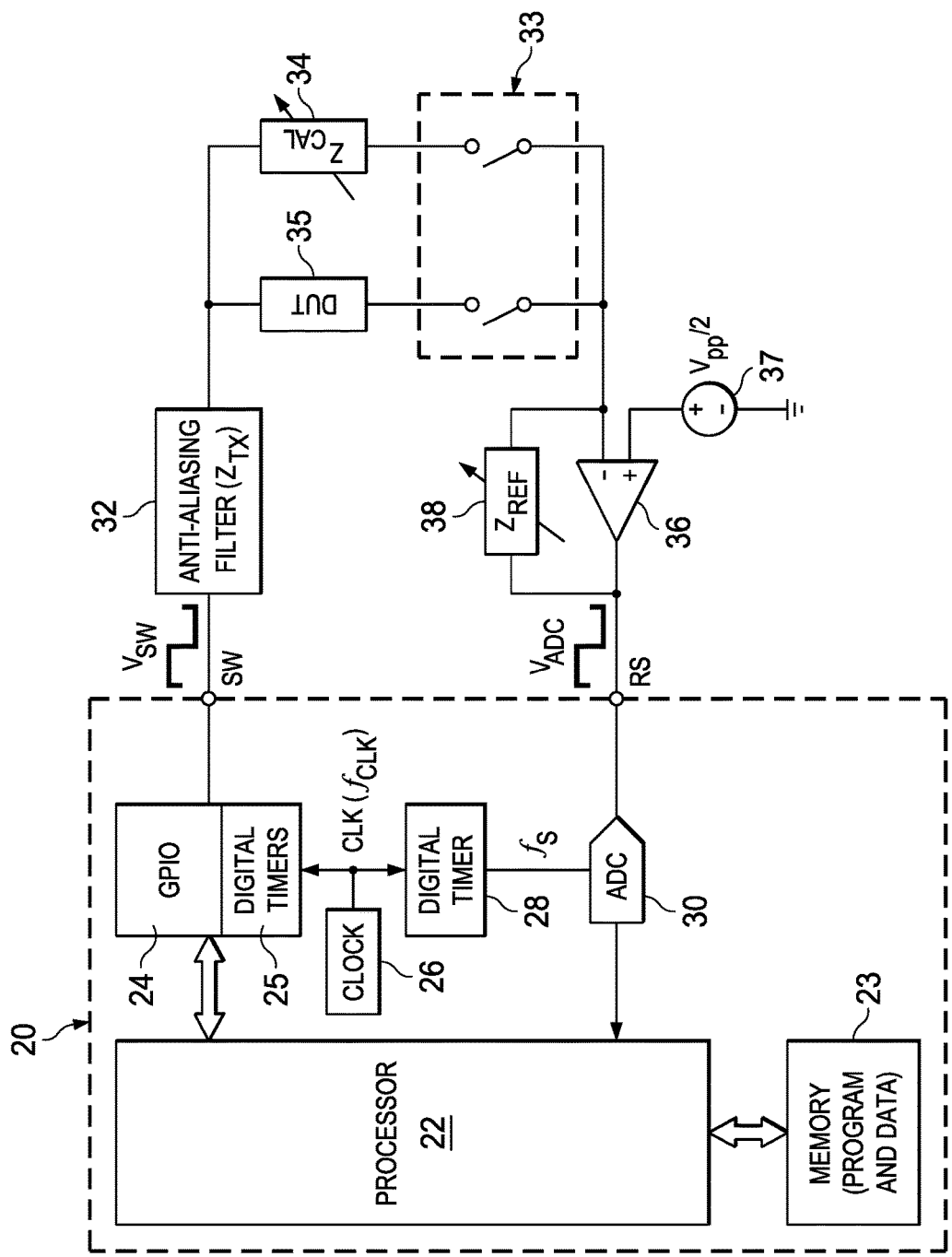
FIG. 2 is an electrical diagram, in block form, of a microcontroller-based impedance analyzer according to certain embodiments.

FIG. 2 illustrates a microcontroller-based impedance analyzer constructed according to an embodiment, as may be implemented into a stand-alone sensor (e.g., in the IoT context) or within a larger-scale system or equipment. In this implementation, microcontroller 20 includes the appropriate functional circuitry for generating a stimulus waveform to be applied to a device under test, and for analyzing the response of that device to the stimulus in order to determine its electrical impedance. In this regard, microcontroller 20 includes one or more processors 22 (also referred to as "processor cores") that are capable of executing program instructions for carrying out the operations described in this specification. Memory resource 23 in FIG. 2 represents the memory capacity of microcontroller 20, and as such may include memory blocks of various types, including non-volatile memory (e.g., "flash" or other electrically programmable memory) storing program instructions and configuration data for processor 22 and other functions in microcontroller 20, and also volatile (e.g., dynamic or static RAM) memory for storing data involved in those operations. Some of memory resource 23 may be embedded within processors 22 themselves. Examples of microcontroller devices that are suitable for implementation as microcontroller 20 according to these embodiments include the MSP and C2000x families of microcontrollers available from Texas Instruments Incorporated.

In this embodiment, microcontroller 20 includes general purpose input/output (GPIO) function 24, which is coupled to a terminal SW of microcontroller 20. GPIO 24 includes both input circuitry for receiving and forwarding a digital logic level terminal SW, and driver circuitry for driving a digital voltage level at terminal SW. As typical in the art, GPIO 24 is configured and operates under program control, as executed by processor 22. In this example, the digital logic levels driven at terminal SW by GPIO 24 in its form as an output are constituted by a power supply voltage $V_{pp}$ and ground ($V_{ss}$, or 0 volts). Of course, other digital output voltage levels may alternatively be output from GPIO 24, depending on the construction of the driver circuitry. In this embodiment, GPIO 24 is so configured and operates to drive a square wave signal $V_{SW}$ at these two levels ($V_{pp}$, $V_{ss}$) that will serve as the stimulus applied to device under test (DUT) 35 to measure its electrical impedance.

Processor 22 is also coupled to analog-to-digital converter (ADC) 30, which is in turn coupled (via conventional "analog front end" circuitry, not shown) to a terminal RS of microcontroller 20. ADC 30 operates to periodically sample and digitize the voltage at its terminal RS, producing a sample stream that is forwarded to processor 22. According to these embodiments, the voltage sampled by ADC 30 represents the response of DUT 15 to the stimulus of square wave signal $V_{SW}$ applied from GPIO 24. Processor 22 in turn executes the appropriate program instructions, for example as stored in memory resource 23, to determine an impedance measurement for DUT 35 from those sampled voltages. According to these embodiments and as will be described in further detail below, processor 22 will determine that impedance measurement by performing a discrete Fourier transform (DFT) on the sample stream acquired by ADC 30 from the response of DUT 35 to the applied stimulus.

Figure 1:
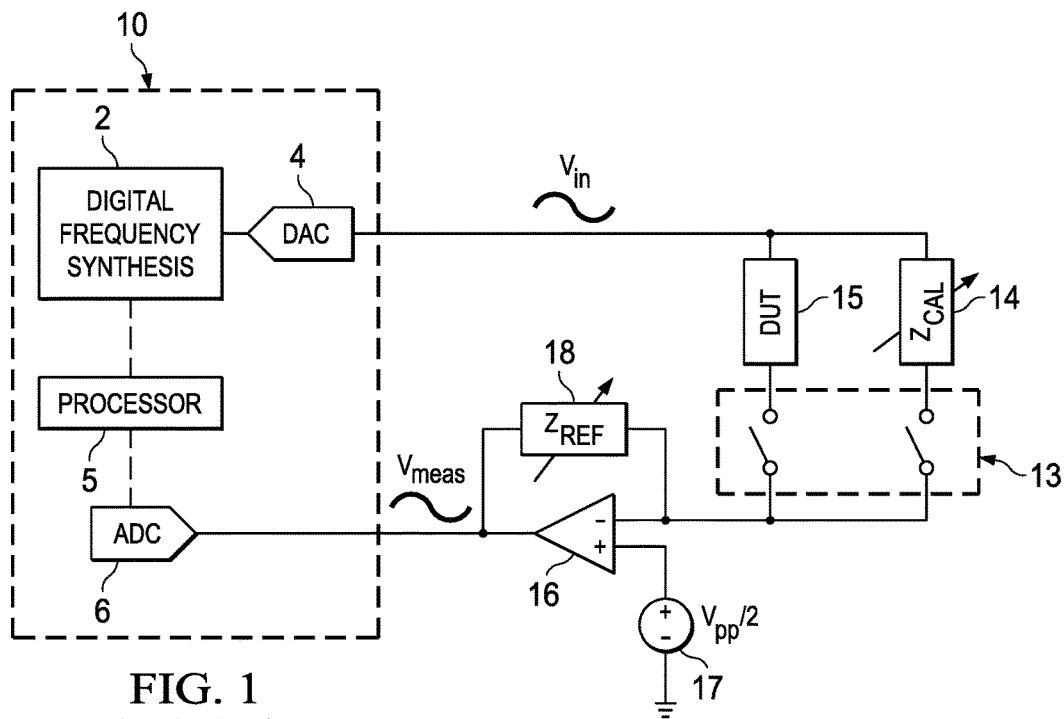
FIG. 1 is an electrical diagram, in block form, of a conventional microcontroller-based impedance analyzer.

As evident from this description, the stimulus applied to DUT 35 for the impedance measurement is not a sinusoid as in the conventional architecture of FIG. 1, but rather is a square wave signal $V_{SW}$ as generated by GPIO 24. Those skilled in the art will recognize that the use of a square wave will contain frequency components other than the single frequency of a sinusoid, which in this context will complicate the measurement of the electrical impedance of DUT 35. According to these embodiments, however, the generation of the square wave stimulus and the timing of the sampling of the response are based on the same clock signal at a relationship that accounts for lower harmonics of the fundamental square wave stimulus frequency.

Referring to FIG. 2, clock generator circuitry 26 of microcontroller 20 generates a relatively high-speed base clock signal CLK, at frequency $f_{CLK}$, on which both the square wave stimulus $V_{SW}$ and the sampling frequency $f_{ADC}$ applied by ADC 30 are based. In these embodiments, base clock frequency $f_{CLK}$ will be at a higher frequency than either the square wave stimulus frequency $f_{SW}$ or the sampling frequency $f_{ADC}$. As such, the stimulus and sampling frequencies can be generated within microcontroller 20 by relatively simple frequency divider functions, without requiring expensive and complex circuitry such as fractional phase-locked loops and the like as conventionally used to generate sinusoids at specific frequencies. On the stimulus side, base clock signal CLK is applied to digital timers 25 associated with GPIO 24, which divide down the frequency $f_{CLK}$ by an integer divisor to derive the timing of the square wave stimulus. For example, digital timers 25 may include a digital counter that issues a control signal to GPIO 24 to begin a cycle of the square wave (e.g., issue a rising edge) upon the elapsing of a specified number of cycles of clock signal CLK. A second digital counter may also be included within digital timers 25 to define the duty cycle of the square wave stimulus, for example by controlling GPIO 24 to end a pulse (e.g., issue a rising edge) upon the elapsing of a specified number of cycles of clock signal CLK. As such, both the period of the square wave stimulus and its duty cycle are derived as an integer number of cycles of clock signal CLK, according to this embodiment.

Similarly, digital timer 28 is provided in microcontroller 20 to control the sampling frequency $f_{ADC}$ at which ADC 30 samples the response voltage at its corresponding terminal. In this embodiment, digital timer 28 controls ADC 30 to sample and digitize the response voltage upon the elapsing of a specified number of cycles of base clock signal CLK. As such, sampling frequency $f_{ADC}$ is divided down, by a selected integer divisor value, from the frequency $f_{CLK}$ of base clock signal CLK. The relationship of this integer value that defines sampling frequency $f_{ADC}$ and the integer value that defines square wave stimulus frequency $f_{SW}$ according to these embodiments will be described in further detail below.

In the architecture of FIG. 2, terminal SW driven by GPIO 24 is coupled to anti-aliasing filter 32, which is constructed to attenuate higher harmonics of the fundamental frequency of square wave stimulus $V_{SW}$. Filter 32 may be a conventional off-chip (i.e., outside of microcontroller 20) analog low-pass filter of the desired frequency response. For example, filter 32 may be constructed as a conventional $4^{th}$ order multiple feedback low-pass filter, or alternatively as any one of a number of filter architectures and topologies to attain the desired characteristic. Anti-aliasing filter 32 may alternatively be constructed as a band-pass frequency selective frequency filter, rather than a low-pass filter, if desired. If desired, anti-aliasing filter 32 may have a gain less than 1 in order to reduce the peak-to-peak voltage swing of the square wave stimulus as applied to DUT 35, to prevent signal saturation. In any case, anti-aliasing filter 32 is provided to minimize the effect of higher harmonics of the square wave stimulus, so that these harmonics do not significantly contaminate the measured response of DUT 35 at the fundamental frequency of that stimulus waveform.

DUT 35 is connected at the other side of anti-aliasing filter 32 from GPIO 24 to receive the filtered square wave stimulus $V_{SW}$. In this embodiment, DUT 35 is connected in parallel with variable calibration impedance 34, with switching multiplexer 33 provided in series with these loads 34, 35 to select one or the other for inclusion in the measurement circuit. It is contemplated that switching multiplexer 33 will be controlled by processor 22 or other control circuitry in the system to switch in calibration impedance 34 and switch out DUT 35 when performing calibration of the measurement system, and to switch out calibration impedance 34 and switch in DUT 35 for the impedance measurement. The calibration operation of the architecture of FIG. 2 will be described in further detail below.

An inverting amplifier circuit receives and amplifies the response of DUT 35 to the stimulus from GPIO 24 according to this embodiment. As shown in FIG. 2, DUT 35 (or calibration impedance 34, as the case may be) is applied to a inverting input of differential operational amplifier 36. The non-inverting input of op amp 36 receives a DC voltage equal to the expected DC voltage of the square wave signal; in this example, voltage source 37 applies a voltage of one-half the peak-to-peak amplitude of the square wave stimulus $V_{SW}$, for example one-half the supply voltage ($V_{pp}/2$). The output of op amp 36 is coupled to terminal RS of microcontroller 20, and thus to ADC 30 (via front end circuitry within microcontroller 20, not shown). Reference impedance 38 is connected between the output and the inverting input of op amp 36, in the well-known negative feedback manner. Reference impedance 38 is preferably a precision resistor or variable impedance (e.g., a bank of precision resistors in combination with switches for selectably switching one or more of the resistors into the circuit), and thus has a known impedance for purposes of this impedance measurement.

In measuring the impedance of DUT 35, the inverting amplifier arrangement of op amp 36 and reference impedance 38 will result in the negative feedback current conducted through reference impedance 38 being equal to the current conducted by DUT 35, under the ideal op amp assumption that the inverting input of op amp 36 is at a virtual ground and presents infinite input impedance. Measurement of the response voltage $V_{ADC}$ at terminal RS will thus provide a measure of the current through reference impedance 38 because its impedance $Z_{REF}$ is known. Because the amplitude $V_{SQ}$ is also known (e.g., at supply voltage $V_{pp}$) the response voltage $V_{ADC}$ provides a measure of the impedance $Z_{DUT}$ of DUT 35. More specifically, an estimate $\hat{Z}_{DUT}(f)$ of the impedance of DUT 35 at frequency f can be determined by the architecture of FIG. 2 as:

$$\hat{Z}_{DUT}(f) \approx Z_{REF}\left(\frac{V_{SW}(f)}{V_{ADC}(f)}\right) - Z_{TX}$$

where $Z_{TX}$ is an estimate or measurement of the impedance of anti-aliasing filter 32.

As mentioned above, calibration impedance 34 is connected in parallel with DUT 35, in the signal path between anti-aliasing filter 32 and op amp 36; switching multiplexer 33 operates to switch in either DUT 35 or calibration impedance 34, under the control of processor 22. Calibration impedance 34 may be realized as a resistor or other impedance element with a known impedance value $Z_{CAL}$ measured to the desired precision. As suggested by FIG. 2, calibration impedance 34 may be a variable impedance, for example realized by multiple precision resistors of varying resistance values that may be selectably switched in and out of the circuit, to perform accurate calibration over a wide range of potential DUT impedances.

In general, calibration of the impedance analyzer of FIG. 2 is performed by operating the circuit to measure the impedance of calibration impedance 34 at one or more frequencies, and comparing the measured impedance with the known impedance value $Z_{CAL}$. The manner in which calibration impedance 34 is measured will follow the same approach as described below in connection with FIG. 3 et seq. Differences between the measured impedance value $Z_{CAL}$ and the known impedance of calibration impedance 34 may arise because of non-idealities in op amp 36, variations in the transfer function of anti-aliasing filter 32 from the ideal, inaccuracy in the impedance value of reference impedance 38, and parasitic impedances throughout the circuit, for example at the fixture in which DUT 35 will be inserted for measurement. These differences between the measured and known calibration impedance values $Z_{CAL}$ over frequency may then be used to adjust the corresponding impedance measurements obtained for DUT 35 at those frequencies, in the conventional manner.

Figure 3:
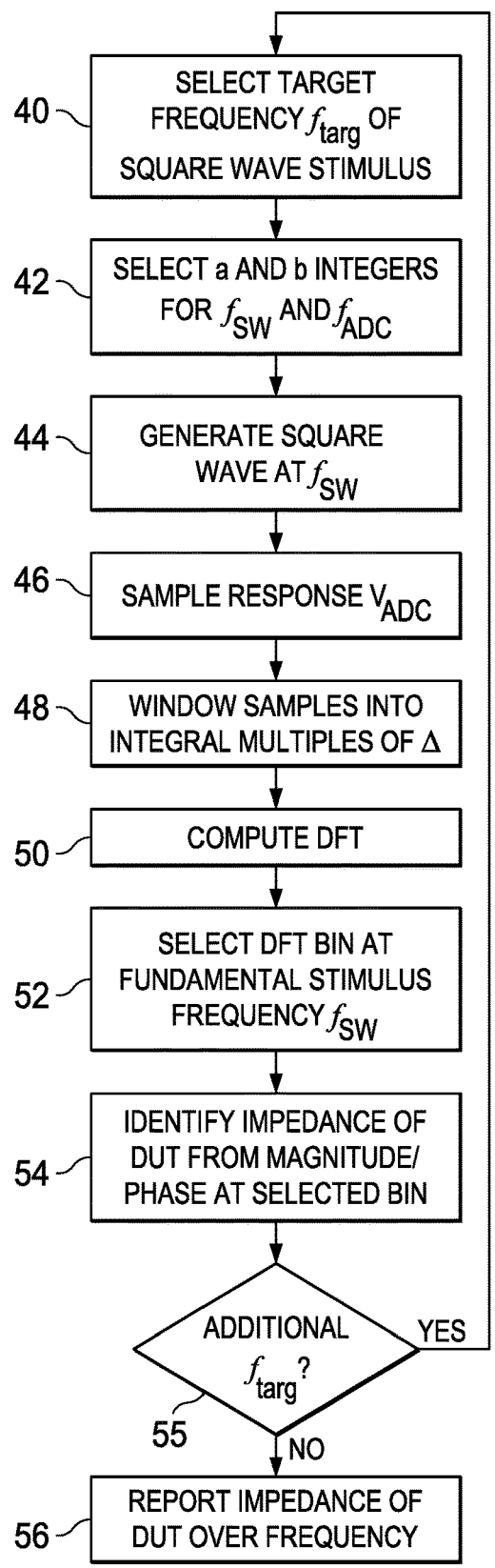
FIG. 3 is a flow diagram illustrating a method of measuring impedance according to certain embodiments.

Referring now to FIG. 3, the general operation of the microcontroller-based impedance analyzer system of FIG. 2 in measuring and analyzing the impedance of DUT 35 over a range of frequencies will now be described. As discussed above, it is contemplated that the appropriate calibration adjustment values have been previously determined over the desired frequency range and over the expected range of DUT impedances. Also as the process of FIG. 3 begins, DUT 35 will have been inserted or otherwise connected into the system of FIG. 2, and switching multiplexer 33 controlled to switch the fixture containing DUT 35 into the circuit and switch calibration impedance 34 out of the circuit.

In process 40, a target frequency $f_{targ}$ at which measurement of the electrical impedance of DUT 35 is to be made is selected, for example in response to a user input communicated to microcontroller 20, or according to an instruction sequence being executed by processor 2 in which the desired target frequencies are established in advance. This target frequency $f_{targ}$ selected in process 40 is the desired frequency $f_{SW}$ of the square wave stimulus $V_{SW}$ generated by GPIO 24. Stimulus frequency $f_{SW}$ is generated by dividing down the frequency $f_{CLK}$ of base clock signal CLK by frequency divisor integer a, such that:

$$T_{SW} = a \cdot T_{CLK}$$

where $T_{SW}$ and $T_{CLK}$ are the periods of the stimulus frequency $f_{SW}$ and the base clock frequency $f_{CLK}$, respectively. Similarly, the sampling rate $f_{ADC}$ of ADC 30 is also divided down from the base clock frequency $f_{CLK}$, by frequency divisor integer b:

$$T_{ADC} = b \cdot T_{CLK}$$

where $T_{ADC}$ is the sampling period at ADC 30. In process 42 according to these embodiments, the frequency divisor integers a and b are selected to produce the desired square wave stimulus frequency $f_{SW}$ and desired sampling rate $f_{ADC}$ at a relationship that reduces interference from aliased harmonics with the fundamental frequency of the response of DUT 35 to that stimulus.

Figure 4:
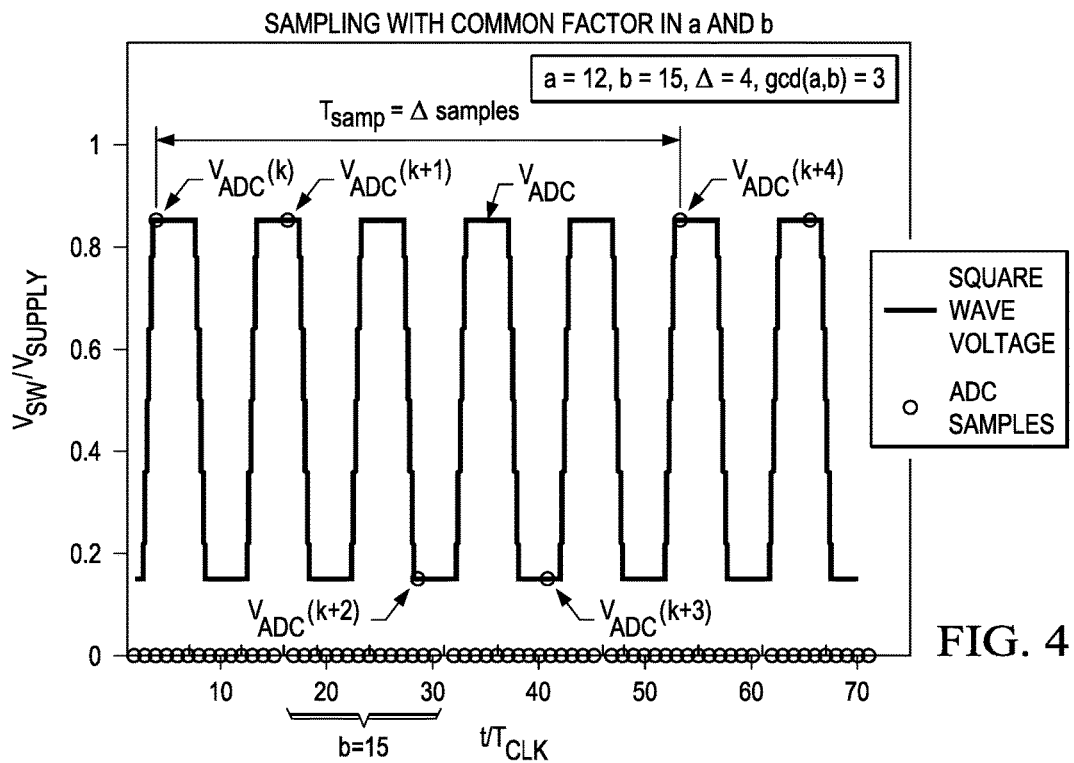
FIG. 4 is a time-based plot illustrating the selection of sampling frequency in the method of FIGS. 2 and 3 according to an embodiment.

FIG. 4 illustrates a simplified example of the relationship between frequency divisor integers a and b relative to the timing of response waveform $V_{ADC}$ appearing at terminal RS, from op amp 36. Because the fundamental frequency of the response $V_{ADC}$ will not be shifted from that of stimulus $V_{SW}$, the period of the response waveform $V_{ADC}$ is equal to the period $T_{SW}$ of stimulus waveform $V_{SW}$ and the response $V_{ADC}$. In the example of FIG. 4, frequency divisor a has the value 12, and frequency divisor b has the value 15. As such, the stimulus period $T_{SW}$ is twelve cycles of base clock signal CLK, and the sampling period $T_{ADC}$ is fifteen cycles of base clock signal CLK. In this example, a sample $V_{ADC}(k)$ is acquired by ADC 30 at a point in time coinciding with a rising edge of response waveform $V_{ADC}$, and the next three samples $V_{ADC}(k+1)$, $V_{ADC}(k+2)$, and $V_{ADC}(k+3)$ are acquired at points in time corresponding to different phases of response waveform $V_{ADC}$. In this example, the relationship of integers a and b (and thus the relationship between the stimulus period $T_{SW} = a \cdot T_{CLK}$ and the sampling period $T_{ADC} = b \cdot T_{CLK}$) results in the fourth sample $V_{ADC}(k+4)$ being acquired coincident with the rising edge of response waveform $V_{ADC}$. One can derive a separation number corresponding to the number of samples $V_{ADC}(n)$ acquired by ADC 30 at distinct phases of the response waveform $V_{ADC}$ as:

$$\Delta = \frac{a}{gcd(a, b)}$$

where gcd(a, b) is the greatest common divisor of integers a, b. In the example of FIG. 4, the greatest common divisor of a=12 and b=15 is gcd(a,b)=3. Accordingly, samples $V_{ADC}(n)$ are acquired at the same phase of response signal $V_{ADC}$ every $\Delta=4$ samples, which is represented in FIG. 4 as the period $T_{samp} = \Delta \cdot T_{ADC} = 4 \, T_{ADC}$.

This separation number $\Delta$, which corresponds to the density of distinct phases of the stimulus waveform $V_{SW}$ that are sampled by ADC 30, provides an indication of the resolution of the measured response $V_{ADC}$. In an undersampled situation such as that shown in FIG. 4, and assuming that the sampled waveform is periodic and stable, one can reconstruct the waveform at high resolution by reordering samples acquired at different phases of the waveform over a number of cycles. In the case shown in FIG. 4, the separation $\Delta=4$ results in only distinct phases being sampled, regardless of the number of cycles. From the standpoint of resolution and precision, it is therefore useful for the separation number $\Delta$ to be as large as possible. Because the separation number Δ is inversely proportional to the greatest common divisor of frequency divisor integers a and b, the largest separation number Δ of samples for a given value of frequency divisor a, will be obtained by selecting integers a and b in process 42 to be relatively prime.

According to these embodiments, additional constraints due to limitations in the circuitry in microcontroller 20 are also considered in selection of frequency divisor integers a and b in process 42. One such constraint is the maximum sampling frequency of ADC 30. It is contemplated that this maximum sampling frequency may be relatively low, especially for microcontroller-based implementations in which ADC 30 is relatively low performance to reduce device cost. Because measurement accuracy is improved at higher sampling rates, it is optimal for integer b to be selected so that the sampling frequency $f_{ADC}$ is as close to the maximum available frequency as possible. For example, if the frequency $f_{CLK}$ of clock signal CLK is 48 MHz and the maximum sampling frequency $f_{ADC}$ is 1 MHz, the value of frequency divisor integer b selected in process 42 is at least 48, preferably as close to 48 as possible to obtain the highest possible sampling resolution.

As mentioned above and as will be described in further detail below, processor 22 will operate to determine the impedance of DUT 35 by executing a discrete Fourier transform (DFT) on the sample stream of response voltage $V_{ADC}$ acquired by ADC 30. Those skilled in the art will recognize that the DFT of a sample stream involves the "windowing" of the sample stream into a number of samples that are considered as the signal values within one period of a periodic sampled signal of infinite duration. While large numbers of samples within a DFT window are preferred, the available memory, computational capacity for the DFT operation, and time required to make a measurement typically constrain the maximum DFT window length.

In addition, it has been discovered, according to these embodiments, that the selection in process 42 of the frequency divisor integer values a and b is important in reducing the interference from aliased harmonics with the fundamental frequency of the response voltage $V_{ADC}$. This is accomplished, according to these embodiments, by selecting frequency divisor integers a, b so that the number of samples N in a DFT window is an integer multiple of the separation number Δ of samples acquired at distinct phases of the response waveform acquired by ADC 30. Referring to FIG. 4, it is evident that the period $T_{samp}$ of Δ samples corresponds to an integer number of cycles of the stimulus (and response) waveform. By selecting the window length N to be an integer multiple of the separation number Δ (i.e., N=qΔ, for some integer q), and because a group of Δ samples itself represents an integer number of periods $T_{SW}$, the DFT window of length N will cover an integer number of periods $T_{SW}$. Lower order aliased harmonics of the fundamental frequency will tend to fall into different DFT bins from the fundamental DFT bin, which is the bin of importance for determining the impedance of DUT 35. Conversely, the strongest aliased harmonic affecting the fundamental frequency bin can be a higher order harmonic, preferably at a frequency that can be attenuated by anti-aliasing filter 32. In many cases, it has been observed that the effect of these higher order aliased harmonics on the DFT analysis of the impedance can be held below the white noise floor of the system, which allows ADC 30 to under-sample response voltage $V_{ADC}$.

It has further been observed, according to these embodiments, that the value of the separation number Δ of samples acquired by ADC 30 at distinct phases of the response waveform can affect the level of aliased harmonic noise on the response signal at the fundamental frequency. In a general sense, the interference resulting from these aliased harmonics appears as a set of equally spaced tones near the fundamental frequency. But it has been observed that odd-numbered values of the separation number Δ results in this interference appearing as a series of equally-spaced tones with alternating positive and negative amplitudes. Similarly, even-numbered values of the separation number Δ that are not divisible by four also results in interference in the form of a series of equally-spaced tones with alternating positive and negative amplitudes, but with a greater net amplitude than in the odd-valued Δ case. In contrast, values of the separation number Δ that are divisible by four result in the interference series having tones on the low side of the fundamental frequency that all have the same polarity amplitude (e.g., negative amplitude) and tones on the high side that all have the same polarity amplitude (e.g., positive amplitude), amounting to an overall higher level of aliased harmonic interference with the response signal at the fundamental frequency.

Figure 5:
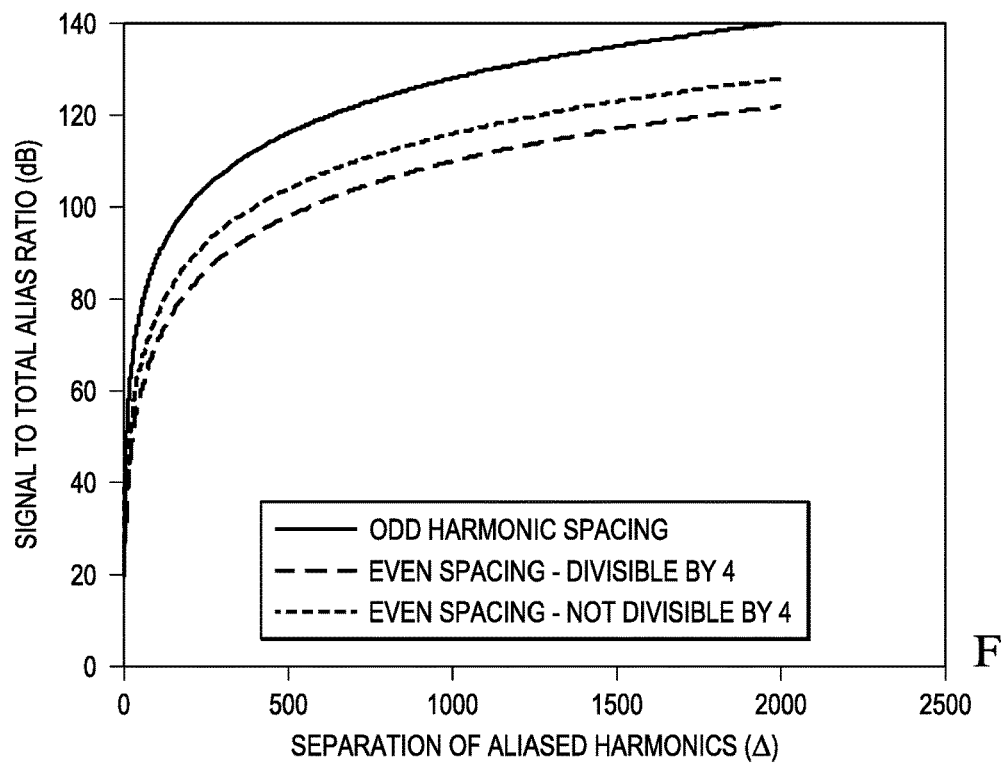
FIG. 5 is a plot of signal-to-alias ratio over separation number values, according to an embodiment.

FIG. 5 illustrates an example comparison of the tone-to-interference (i.e., signal-to-total alias) ratio as a function of the value of the separation number Δ, for the cases of odd, even but not-divisible-by-four, and divisible-by-four values. In this Figure, the total interference amounts to the sum of the interference from the first 10,000 aliased harmonics, without anti-aliasing filter 32. As evident from this plot, the signal-to-alias ratio for odd values of separation number Δ is significantly higher (e.g., about 15 dB at Δ≈2000) than even, not-divisible-by-four values, and higher yet (e.g., about 20 dB at Δ≈2000) than values that are divisible-by-four. FIG. 5 also illustrates that larger separation number Δ values provide improved signal-to-alias ratio performance.

According to these embodiments, therefore, the selection of frequency divisor integers a, b is performed in process 42 subject to a set of constraints. First, frequency divisor a is selected as an integer value that establishes the fundamental frequency $f_{SW}=f_{CLK}/a$ of the square wave stimulus $V_{SW}$ at or close to the target frequency $f_{targ}$ at which the impedance of DUT 35 is intended to be measured. Second, frequency divisor b is selected in process 42 as an integer value that establishes a sample rate $f_{ADC}=f_{CLK}/b$ that is below the maximum sample rate of ADC 30; for best resolution, it is desirable that frequency divisor b is selected so that the sample rate $f_{ADC}$ is close to that maximum sample rate.

Third, frequency divisor integers a, b are selected in process 42 so that the separation number Δ=a/gcd(a,b) is large, to reduce the interference from aliased harmonics in the fundamental frequency of the response $V_{ADC}$. In this regard, selection of integers a, b that are relatively prime will maximize the separation number Δ for a given value of frequency divisor a. For minimum harmonic interference at the fundamental frequency, it is desirable that the separation number Δ be odd-numbered if possible, or if not, even-numbered but not divisible by four. The selection of integers a, b to arrive at the separation number Δ is also constrained by the maximum window length (in samples) of the DFT implemented by processor 22, in combination with the constraint that the number of samples in the DFT window being an integer multiple of the separation number Δ (N=qΔ). For values of frequency divisor a larger than the maximum window size, frequency divisor integers a, b will not be relatively prime. In any case, it is desirable for the separation number Δ to be as large as possible while meeting the DFT window requirement of N=qΔ.

In addition to the selection of frequency divisor integers a, b to meet these constraints and desired properties, process 42 may include or be based on simulation or measurement of tone-to-interference ratios at candidate values of integers a, b, with the final selection of those frequency divisor values made based on a comparison of their signal-to-alias performance. In this context, anti-aliasing filter 32 may be modeled to have the desired or expected characteristics, for example modeled as a cascade of identical single-pole stages with selected cutoff frequencies.

It is contemplated that the selection of frequency divisor integers a, b in process 42 can be carried out by way of conventional integer linear programming routines and the like, either performed by processor 22 "on-the-fly" in response to the selection of a target frequency for the impedance measurement, or performed off-line to provide pre-programmed program instructions stored in memory 23 for execution by processor 22 or other logic in microcontroller 20. Alternatively, it is contemplated that the user may input the values of frequency divisor integers a, b, for example by storing configuration information or program code in memory 23 of microcontroller.

Frequency divisor selection process 42 is completed by processor 22 or other appropriate logic circuitry in microcontroller 20 setting digital timers 25, 28 with the appropriate configuration values or data corresponding to the selected frequency divisor integers a, b, respectively. In the case of digital timers 25, both a frequency (i.e., integer a) and a duty cycle (nominally 50%) for the desired stimulus waveform $V_{SW}$ may be set. Measurement of the impedance of DUT 35 at the selected stimulus frequency $f_{SW}$ may then begin.

In process 44, microcontroller 20 in this embodiment generates the square wave stimulus $V_{SW}$ for application to DUT 35. In the architecture of FIG. 2 described above, GPIO function 24 produces stimulus $V_{SW}$ by driving terminal ST at high and low voltages at the frequency and duty cycle configured into digital timers 25 in process 42. These voltage levels can be at the rail voltages (e.g., supply voltage $V_{pp}$ and ground, respectively), as typical for GPIO functions in conventional microcontrollers, or at other digital logic levels if desired. Stimulus voltage $V_{ADC}$ is filtered by anti-aliasing filter 32 and applied to DUT 35, which has been switched into the measurement loop by switching multiplexer 33. As described above, the inverting amplifier arrangement of op amp 36, reference impedance 38, and voltage source 37 present a response voltage $V_{ADC}$ at terminal RS, for receipt and processing by microcontroller 20.

In process 46, ADC 30 samples the response voltage $V_{ADC}$ received at terminal RS (after buffering and filtering by conventional analog circuitry within microcontroller 20), at the sampling frequency $f_{ADC}$ corresponding to the base clock frequency $f_{CLK}$ divided by the frequency divisor integer b selected in process 42. The resulting sample stream is forwarded to processor 22 for DFT analysis of the response of DUT 35 at the fundamental frequency. In carrying out that DFT analysis, the sample stream of the response is windowed in process 48, with the number of samples in the DFT window being an integral multiple of the separation number Δ. As described above, the separation number Δ corresponds to the stimulus frequency divisor integer a divided by the greatest common divisor of frequency divisor integers a, b.

In process 50, a DFT algorithm is executed by processor 22 on the sample window acquired in process 48. Any one of a number of conventional discrete Fourier transform approaches may be carried out by processor 22 in this process 50, examples of such DFT techniques including Fast Fourier Transform algorithms and the like. As discussed above, because the stimulus and sampling frequencies are both based on the same high-speed clock signal CLK, and because of the selection of the frequency divisor integers a, b that determine those frequencies and the arrangement of the DFT window as an integer multiple of the separation number Δ based on those integers, lower order aliased harmonics of the fundamental frequency fall into different DFT bins from that of the fundamental frequency itself.

Figure 6:
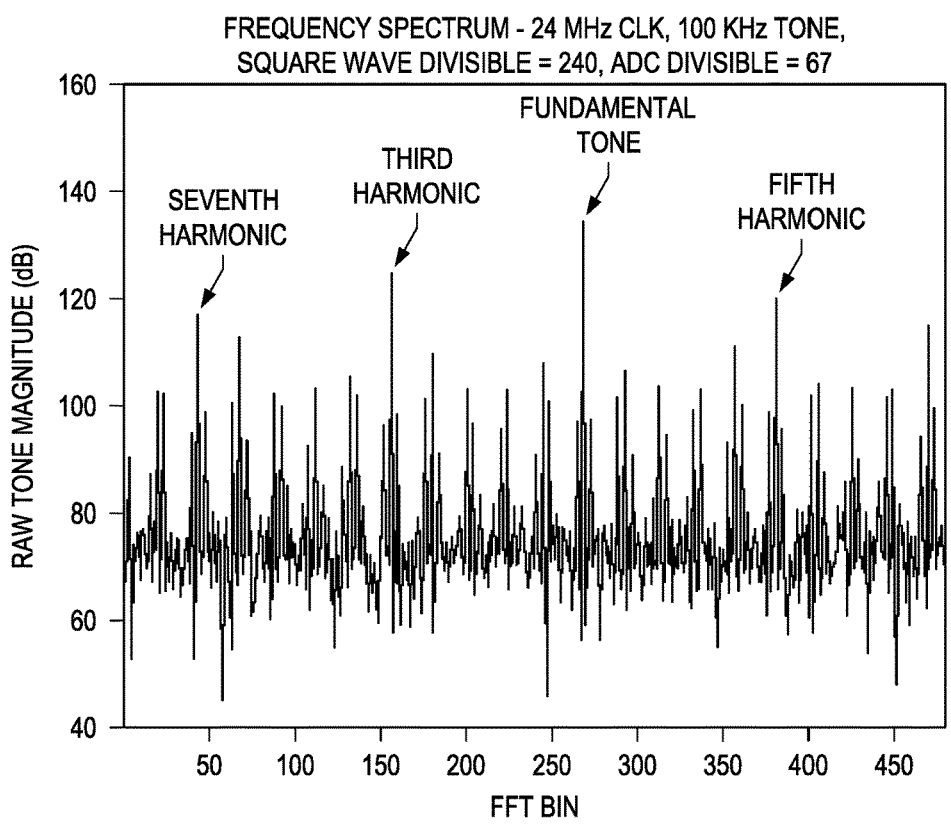
FIG. 6 is a plot illustrating the magnitude of frequency components including a fundamental tone and lower order harmonics over DFT bins.

FIG. 6 illustrates an example of the results of process 50 illustrating the magnitude of the response of a DUT to a square wave stimulus at a frequency $f_{SW}$=100 kHz, based on $f_{CLK}$=24 MHz and frequency divisor integer a=240, and in which an FFT was performed on a sample stream acquired at a sample frequency of about 358 kHz using frequency divisor integer b=67. As evident from the plot of magnitude over a number of bins shown in FIG. 6, lower order harmonics such as the third, fifth, and seventh harmonics clearly fall in different FFT bins from that of the fundamental tone (i.e., that associated with square wave stimulus frequency $f_{SW}$=100 kHz), and as such do not interfere with the observed response at the stimulus frequency. As described above, this placement of these lower order harmonics into DFT bins other than the fundamental tone bin results from the DFT window having a size that is an integer multiple of the separation number Δ. Higher orders of aliased harmonics will eventually appear in the DFT bin corresponding to the fundamental square wave stimulus frequency $f_{SW}$. It has been observed, however, that selection of a sufficiently large value of separation number Δ results in these contaminating harmonics being at high enough frequency (e.g., above the $400^{th}$ harmonic) as to have been attenuated by anti-aliasing filter 32. It has been observed that, in many cases, the contribution of those harmonics falling within the selected DFT bin for the fundamental frequency will be below the white noise floor of the system, and thus insignificant.

For purposes of the measurement of the impedance of DUT 35, it can be assumed that DUT 35 does not apply a frequency shift to the stimulus waveform, so that only the stimulus frequency $f_{SW}$ is of interest in determining impedance. This bin for the fundamental frequency may be identified as:

$$\text{bin} = N \bmod\left(\frac{f_{SW}}{f_{ADC}}, 1\right) = N \bmod\left(\frac{b}{a}, 1\right)$$

Accordingly, the DFT bin corresponding to the fundamental stimulus frequency $f_{SW}$ is selected for analysis in process 52, for example after the completion of an FFT or similar algorithm on the windowed samples of the response waveform $V_{ADC}$.

Further efficiencies can be gained in some embodiments because only the DFT bin pertaining to the fundamental stimulus frequency $f_{SW}$ is of interest. In one embodiment, the desired DFT bin is selected in process 52 prior to executing the DFT algorithm in process 50. This allows use of the well-known Goertzl algorithm to compute the DFT result for that selected bin in process 50, without requiring the computation of the response for all of the other DFT bins and thus saving computational time and improving overall system performance. Examples of algorithms based on the Goertzl algorithm are described in Mock, "Add DTMF Generation and Decoding to DSP-uP Designs", Application Report SPRA168 (Texas Instruments Incorporated, 1989), and Chen, "Modified Goertzl Algorithm in DTMF Detection Using the TMS 320080", Application Report SPRA066 (Texas Instruments Incorporated, 1996), both incorporated herein by this reference. Significant efficiency in the computational effort required in DFT process 50 due to significant reduction in the number of operations required, as compared with conventional FFT-type algorithms, can be attained according to this approach.

In process 54, processor 22 determines the impedance of DUT 35 from the results of DFT process 50 for the fundamental frequency bin selected in process 52. It is contemplated that the computations performed in process 54 will be performed in the complex domain, so that both the magnitude and phase components of the DFT are determined in process 50. In general, as discussed above, an impedance estimate $Z_{DUT}(f_k)$ for DUT 35 at a given frequency $f_k$ (where k indicates the DFT bin selected in process 50) can be expressed as:

$$\hat{Z}_{DUT}(f_k) \approx Z_{REF}\left(\frac{V_{SW}(f_k)}{V_{ADC}(f_k)}\right) - Z_{TX}$$

where $Z_{TX}$ is an estimate of the impedance of anti-aliasing filter 32. It is contemplated that those skilled in the art will be readily able to derive the appropriate instruction sequence for execution by processor 22 to evaluate this impedance estimate $\hat{Z}_{DUT}(f_k)$, in the complex domain. The square wave stimulus $V_{SW}$ at frequency $f_{SW}$ and reference impedance $Z_{REF}$ are known quantities. The impedance $Z_{TX}$ of anti-aliasing filter 32 can be estimated from the calibration process described above (and can include contributions of parasitic impedances and other non-idealities in the circuit). In process 54, processor 22 applies the amplitude and phase results from the DFT performed in process 50 on the sampled response $V_{ADC}$, in the DFT bin for the fundamental stimulus and response frequency selected in process 52, to this relationship to determine an impedance estimate $\hat{Z}_{DUT}(f_k)$ for DUT 35 at that frequency $f_k$. Adjustments to this impedance estimate $\hat{Z}_{DUT}(f_k)$ that were determined by measuring calibration impedance 34 in the calibration process described above, may be applied in the conventional manner to the results of these calculations in process 54.

As mentioned above, measurement of the impedance of DUT 35 will typically be performed over a range of stimulus frequencies $f_{SW}$, for example from DC to a high frequency limit, which may range as high as hundreds of kHz or higher. According to the method of FIG. 3, decision 55 is executed to determine whether the impedance of DUT 35 is to be evaluated at additional target frequencies $f_{targ}$. If so (decision 55 is "yes"), the next target frequency $f_{targ}$ is selected in process 40, and the method repeats to carry out the impedance measurement at that next frequency.

Upon the impedance of DUT 35 being measured at all target frequencies $f_{targ}$ of interest (decision 55 is "no"), DUT 35 may be removed from the test fixture. In process 56, the results of the impedance measurement for this instance of DUT 35 is then reported in the desired manner, whether by communicating data corresponding to the measurement results, both magnitude and phase, that were obtained over the range of target frequencies $f_{targ}$ to another computer or data processing system, or by microcontroller 20 itself applying an analysis routine to carry out some or all of the appropriate operations to provide a final result.

According to these embodiments, a low-cost implementation of an impedance analyzer can be readily attained. More specifically, these embodiments allow a digital output from an integrated circuit, such as a GPIO function in a microcontroller, to generate the stimulus for the measurement of an impedance over a range of frequencies, thus eliminating the need for costly and area-intensive circuits such as fractional PLLs and high-precision DACs as conventionally used to generate sinusoids. In addition, these embodiments allow relatively low performance analog-to-digital converters (ADCs) to sample the impedance response, indeed under-sampling the response at higher stimulus frequencies, without resulting in significant interference from aliased harmonics. It is therefore contemplated that impedance analyzer functions according to these embodiments can be deployed into a wider range of applications that would have been cost-prohibitive using conventional circuitry.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A circuit for measuring an impedance of a device under test (DUT), the circuit comprising:
   clock circuitry to generate a base clock signal;
   a driver circuit for generating a square wave stimulus at a stimulus frequency having a period corresponding to a first integer number of cycles of the base clock signal;
   an anti-aliasing filter, adapted to be coupled to the DUT, for filtering the square wave stimulus to remove high frequencies;
   an amplifier circuit, adapted to be coupled to the DUT, to present a response signal from the DUT in response to the filtered stimulus;
   an analog-to-digital converter (ADC) for sampling the response signal at a sample frequency having a period corresponding to a second integer number of cycles of the base clock signal; and
   processor circuitry coupled to the ADC, programmed to execute a discrete Fourier transform (DFT) on the sampled response signal, using a DFT window having a number of samples that is an integer multiple of a separation number, the separation number being the first integer number divided by a greatest common divisor of the first and second integer numbers.

2. The circuit of claim 1, further comprising:
   a first timer for counting a number of cycles of the base clock signal corresponding to the first integer number; and
   a second timer for counting a number of cycles of the base clock signal corresponding to the second integer number;
   wherein the driver circuit is arranged to issue the square wave stimulus in response to the first timer counting the first integer number of cycles of the base clock signal; and
   wherein the ADC is arranged to sample the response signal in response to the second timer counting the second integer number of cycles of the base clock signal.

3. The circuit of claim 2, wherein the clock circuitry, the first and second timers, the driver circuit, the ADC, and the processor circuitry are implemented within a single integrated circuit.

4. The circuit of claim 1, wherein the separation number is odd.

5. The circuit of claim 1, wherein the separation number is even and not divisible by four.

6. The circuit of claim 1, wherein the first and second integer numbers are relatively prime.

7. The circuit of claim 1, further comprising:
a calibration impedance; and
a plurality of switches for selectably coupling one of the calibration impedance and the DUT to the anti-aliasing filter and the amplifier circuit.

8. The circuit of claim 1, wherein the amplifier circuit comprises:
an operational amplifier having a non-inverting input adapted to be coupled to a voltage source, an inverting input adapted to be coupled to the DUT, and an output coupled to the ADC; and
wherein the output of the operational amplifier is adapted to be coupled through a reference impedance to the inverting input of the operational amplifier.

9. The circuit of claim 8, wherein the reference impedance is a variable impedance comprising:
a plurality of impedances; and
switches for selectably coupling one or more of the impedances between the output and the inverting input of the operational amplifier.

10. The circuit of claim 1, wherein the processor circuitry is programmed to: sequentially select a plurality of values of the first integer number, each value corresponding to a different stimulus frequency; and select a value for the second integer number is response to the selected value of the first integer number.

11. The circuit of claim 10, wherein the processor circuitry is programmed to select a value for the second integer number, so that the frequency of the base clock signal divided by the second integer number is less than a maximum sampling frequency of the ADC.

12. The circuit of claim 1, wherein the processor circuitry is further programmed to calculate the impedance of the DUT in response to a magnitude and phase result of the DFT at a selected DFT bin corresponding to the stimulus frequency.

13. A method of measuring an impedance of a device under test (DUT), the method comprising:
generating, by clock circuitry, a base clock signal at a base clock frequency;
selecting, by processor circuitry, a target frequency;
selecting, by the processor circuitry, a first frequency divisor integer, so that the base clock frequency divided by the first frequency divisor integer is near the first target frequency;
selecting, by the processor circuitry, a second frequency divisor integer;
applying, by an anti-aliasing filter, a square wave stimulus signal to the DUT at a stimulus frequency corresponding to the base clock frequency divided by the first frequency divisor integer;
sampling, by an analog-to-digital converter (ADC), a response signal corresponding to a response of the DUT to the square wave stimulus signal, at a sampling frequency corresponding to the base clock frequency divided by the second frequency divisor integer;
computing, by the processor circuitry, a discrete Fourier transform (DFT) on the sampled response signal, using a DFT window having a number of samples that is an integer multiple of a separation number, the separation number being the first frequency divisor integer divided by a greatest common divisor of the first and second frequency divisor integers; and
determining, by the processor circuitry, the impedance of the DUT in response to a magnitude and phase result of the DFT at a selected DFT bin corresponding to the stimulus frequency.

14. The method of claim 13, wherein:
applying the square wave stimulus signal comprises: controlling the anti-aliasing filter to generate the square wave stimulus signal in response to counting a number of cycles of the base clock signal that correspond to the first frequency divisor integer; and
sampling the response signal comprises: controlling the ADC to sample the response signal in response to counting a number of cycles of the base clock signal that correspond to the second frequency divisor integer.

15. The method of claim 14, wherein selecting the second frequency divisor integer comprises:
selecting a value of the second frequency divisor integer, so that the base clock frequency divided by the second frequency divisor integer is less than a maximum sample rate of the analog-to-digital converter.

16. The method of claim 13, wherein the separation number is odd-numbered.

17. The method of claim 13, wherein the separation number is even and not divisible by four.

18. The method of claim 13, wherein the first and second frequency divisor integers are relatively prime.

19. The method of claim 13, wherein the target frequency is a first target frequency, and the method further comprises:
selecting a second target frequency; and
for the second target frequency, repeating the selecting, applying, sampling, computing, and determining.

* * * * *